United States Patent
Burrows et al.

(10) Patent No.: US 7,198,832 B2
(45) Date of Patent: *Apr. 3, 2007

(54) METHOD FOR EDGE SEALING BARRIER FILMS

(75) Inventors: Paul E. Burrows, Kennewick, WA (US); Eric S. Mast, Richland, WA (US); Peter M. Martin, Kennewick, WA (US); Gordon L. Graff, West Richland, WA (US); Mark E. Gross, Pasco, WA (US)

(73) Assignee: Vitex Systems, Inc., San Jose, CA (US)

( * ) Notice: Subject to any disclaimer, the term of this patent is extended or adjusted under 35 U.S.C. 154(b) by 104 days.

This patent is subject to a terminal disclaimer.

(21) Appl. No.: 11/112,860

(22) Filed: Apr. 22, 2005

(65) Prior Publication Data

US 2005/0202646 A1    Sep. 15, 2005

Related U.S. Application Data

(60) Continuation-in-part of application No. 11/068,356, filed on Feb. 28, 2005, which is a division of application No. 09/966,163, filed on Sep. 28, 2001, now Pat. No. 6,866,901, which is a continuation of application No. 09/427,138, filed on Oct. 25, 1999, now Pat. No. 6,522,067.

(51) Int. Cl.
    *H01L 21/56*    (2006.01)

(52) U.S. Cl. .................. 428/1.5; 438/125; 438/126; 438/127; 257/28

(58) Field of Classification Search ........ 428/1.5–1.55; 313/479–480; 257/28; 429/137, 141; 438/125–127
See application file for complete search history.

(56) References Cited

U.S. PATENT DOCUMENTS 2,382,432 A    8/1945    McManus et al.
2,384,500 A    9/1945    Stoll (Continued)

FOREIGN PATENT DOCUMENTS

BE    704 297    2/1968

(Continued)

OTHER PUBLICATIONS

Graupner, W.: Heller, C.M.; Ghosh, A.P.; Howard, W.E. "High Resolution Color Organic Light Emitting Diode Microdisplay Fabrication Method", SPIE Proceedings; vol. 4027; Nov. 6, 2000; pp. 11-19.

(Continued)

*Primary Examiner*—Rene Dye
*Assistant Examiner*—Sow-Fun Hon
(74) *Attorney, Agent, or Firm*—Dinsmore & Shohl LLP

(57) ABSTRACT

An edge-sealed, encapsulated environmentally sensitive device. The device includes at least one initial barrier stack, an environmentally sensitive device, and at least one additional barrier stack. The barrier stacks include at least one decoupling layer and at least one barrier layer. The environmentally sensitive device is sealed between the at least one initial barrier stack and the at least one additional barrier stack. A method of making the edge-sealed, encapsulated environmentally sensitive device is also disclosed.

21 Claims, 5 Drawing Sheets

U.S. PATENT DOCUMENTS

| | | | |
|---|---|---|---|
| 3,475,307 A | 10/1969 | Knox et al. |
| 3,607,365 A | 9/1971 | Lindlof |
| 4,283,482 A | 8/1981 | Hattori et al. |
| 4,313,254 A | 2/1982 | Feldman et al. |
| 4,581,337 A | 4/1986 | Frey et al. |
| 4,842,893 A | 6/1989 | Yializis et al. |
| 4,889,609 A | 12/1989 | Cannella |
| 4,913,090 A | 4/1990 | Harada et al. |
| 4,934,315 A | 6/1990 | Linnebach et al. |
| 4,954,371 A | 9/1990 | Yializis |
| 5,032,461 A | 7/1991 | Shaw et al. |
| 5,036,249 A | 7/1991 | Pike-Biegunski et al. |
| 5,047,131 A | 9/1991 | Wolfe et al. |
| 5,124,204 A | 6/1992 | Yamashita et al. |
| 5,189,405 A | 2/1993 | Yamashita et al. |
| 5,237,439 A | 8/1993 | Misono et al. |
| 5,260,095 A | 11/1993 | Affinito |
| 5,336,324 A | 8/1994 | Stall et al. |
| 5,354,497 A | 10/1994 | Fukuchi et al. |
| 5,395,644 A | 3/1995 | Affinito |
| 5,427,638 A | 6/1995 | Goetz |
| 5,440,446 A | 8/1995 | Shaw et al. |
| 5,464,667 A | 11/1995 | Kohler et al. |
| 5,512,320 A | 4/1996 | Turner et al. |
| 5,536,323 A | 7/1996 | Kirlin et al. |
| 5,547,508 A | 8/1996 | Affinito |
| 5,554,220 A | 9/1996 | Forrest et al. |
| 5,576,101 A | 11/1996 | Saitoh et al. |
| 5,607,789 A | 3/1997 | Treger et al. |
| 5,620,524 A | 4/1997 | Fan et al. |
| 5,629,389 A | 5/1997 | Roitman et al. |
| 5,654,084 A | 8/1997 | Egert |
| 5,681,615 A | 10/1997 | Affinito et al. |
| 5,681,666 A | 10/1997 | Treger et al. |
| 5,684,084 A | 11/1997 | Lewin et al. |
| 5,686,360 A | 11/1997 | Harvey, III et al. |
| 5,693,956 A | 12/1997 | Shi et al. |
| 5,695,564 A | 12/1997 | Imahashi |
| 5,711,816 A | 1/1998 | Kirlin et al. |
| 5,725,909 A | 3/1998 | Shaw et al. |
| 5,731,661 A | 3/1998 | So et al. |
| 5,747,182 A | 5/1998 | Friend et al. |
| 5,757,126 A | 5/1998 | Harvey, III et al. |
| 5,759,329 A | 6/1998 | Krause et al. |
| 5,771,177 A | 6/1998 | Tada et al. |
| 5,771,562 A | 6/1998 | Harvey, III et al. |
| 5,792,550 A | 8/1998 | Phillips et al. |
| 5,795,399 A | 8/1998 | Hasegawa et al. |
| 5,811,177 A | 9/1998 | Shi et al. |
| 5,811,183 A | 9/1998 | Shaw et al. |
| 5,821,692 A | 10/1998 | Rogers et al. |
| 5,844,363 A | 12/1998 | Gu et al. |
| 5,872,355 A | 2/1999 | Hueschen |
| 5,895,228 A | 4/1999 | Biebuyck et al. |
| 5,902,641 A | 5/1999 | Affinito et al. |
| 5,902,688 A | 5/1999 | Antoniadis et al. |
| 5,912,069 A | 6/1999 | Yializis et al. |
| 5,920,080 A | 7/1999 | Jones |
| 5,922,161 A | 7/1999 | Wu et al. |
| 5,929,562 A | 7/1999 | Pichler |
| 5,934,856 A | 8/1999 | Asakawa et al. |
| 5,945,174 A | 8/1999 | Shaw et al. |
| 5,948,552 A | 9/1999 | Antoniadis et al. |
| 5,952,778 A | 9/1999 | Haskal et al. |
| 5,965,907 A | 10/1999 | Huang et al. |
| 5,996,498 A | 12/1999 | Lewis |
| 6,040,017 A | 3/2000 | Makhael et al. |
| 6,066,826 A | 5/2000 | Yializis |
| 6,083,628 A | 7/2000 | Yializis |
| 6,092,269 A | 7/2000 | Yializis et al. |
| 6,106,627 A | 8/2000 | Yializis |
| 6,118,218 A | 9/2000 | Yializis et al. |
| 6,146,225 A | 11/2000 | Sheats et al. |
| 6,146,462 A | 11/2000 | Yializis et al. |
| 6,150,187 A | 11/2000 | Zyung et al. |
| 6,195,142 B1 | 2/2001 | Gyotoku et al. |
| 6,198,217 B1 | 3/2001 | Suzuki et al. |
| 6,198,220 B1 | 3/2001 | Jones et al. |
| 6,203,898 B1 | 3/2001 | Kohler et al. |
| 6,207,238 B1 | 3/2001 | Affinito |
| 6,207,239 B1 | 3/2001 | Affinito |
| 6,214,422 B1 | 4/2001 | Yializis |
| 6,217,947 B1 | 4/2001 | Affinito |
| 6,224,948 B1 | 5/2001 | Affinito |
| 6,228,434 B1 | 5/2001 | Affinito |
| 6,228,436 B1 | 5/2001 | Affinito |
| 6,231,939 B1 | 5/2001 | Shaw et al. |
| 6,264,747 B1 | 7/2001 | Shaw et al. |
| 6,268,695 B1 | 7/2001 | Affinito |
| 6,274,204 B1 | 8/2001 | Affinito |
| 6,348,237 B2 | 2/2002 | Kohler et al. |
| 6,358,570 B1 | 3/2002 | Affinito |
| 6,397,776 B1 | 6/2002 | Yang et al. |
| 6,420,003 B2 | 7/2002 | Shaw et al. |
| 6,436,544 B1 | 8/2002 | Veyrat et al. |
| 6,465,953 B1 | 10/2002 | Duggal |
| 6,497,924 B2 | 12/2002 | Affinito |
| 6,509,065 B2 | 1/2003 | Affinito |
| 6,537,688 B2 | 3/2003 | Silvernail |
| 6,544,600 B2 | 4/2003 | Affinito et al. |
| 6,576,351 B2 | 6/2003 | Silvernail |
| 6,592,969 B1 | 7/2003 | Burroughes et al. |
| 6,597,111 B2 | 7/2003 | Silvernail |
| 6,613,395 B2 | 9/2003 | Affinito et al. |
| 6,614,057 B2 | 9/2003 | Silvernail et al. |
| 6,624,568 B2 | 9/2003 | Silvernail |
| 6,627,267 B2 | 9/2003 | Affinito |
| 6,628,071 B1 | 9/2003 | Su |
| 6,653,780 B2 | 11/2003 | Sugimoto et al. |
| 6,656,537 B2 | 12/2003 | Affinito |
| 6,664,137 B2 | 12/2003 | Weaver |
| 6,681,716 B2 | 1/2004 | Schaepkens |
| 6,734,625 B2 | 5/2004 | Vong et al. |
| 6,743,524 B2 | 6/2004 | Schaepkens |
| 6,749,940 B1 | 6/2004 | Terasaki et al. |
| 6,765,351 B2 | 7/2004 | Forrest et al. |
| 6,815,887 B2 | 11/2004 | Lee et al. |
| 6,818,291 B2 | 11/2004 | Funkenbusch et al. |
| 6,836,070 B2 | 12/2004 | Chung et al. |
| 6,837,950 B1 | 1/2005 | Berard |
| 6,864,629 B2 | 3/2005 | Miyaguchi et al. |
| 6,866,901 B2 * | 3/2005 | Burrows et al. ............ 428/1.5 |
| 6,867,539 B1 | 3/2005 | McCormick et al. |
| 6,872,114 B2 | 3/2005 | Chung et al. |
| 6,872,248 B2 | 3/2005 | Mizutani et al. |
| 6,878,467 B2 | 4/2005 | Chung et al. |
| 6,888,305 B2 | 5/2005 | Weaver |
| 6,888,307 B2 | 5/2005 | Silvernail et al. |
| 6,891,330 B2 | 5/2005 | Duggal et al. |
| 6,897,474 B2 | 5/2005 | Brown et al. |
| 6,897,607 B2 | 5/2005 | Sugimoto et al. |
| 6,905,769 B2 | 6/2005 | Komada |
| 6,936,131 B2 | 8/2005 | McCormick et al. |
| 6,975,067 B2 | 12/2005 | McCormick et al. |
| 6,998,648 B2 | 2/2006 | Silvernail |
| 7,002,294 B2 | 2/2006 | Forrest et al. |
| 7,012,363 B2 | 3/2006 | Weaver et al. |
| 7,015,640 B2 | 3/2006 | Schaepkens et al. |
| 7,018,713 B2 | 3/2006 | Padiyath et al. |
| 7,029,765 B2 | 4/2006 | Kwong et al. |
| 2001/0015620 A1 | 8/2001 | Affinito |
| 2002/0022156 A1 | 2/2002 | Bright |
| 2002/0068143 A1 | 6/2002 | Silvernail |
| 2002/0069826 A1 | 6/2002 | Hunt et al. |

| | | | | | |
|---|---|---|---|---|---|
| 2002/0102818 A1 | 8/2002 | Sandhu et al. | JP | 6-234186 | 8/1994 |
| 2002/0125822 A1 | 9/2002 | Graff et al. | JP | 8-72188 | 3/1996 |
| 2002/0139303 A1 | 10/2002 | Yamazaki et al. | JP | 8-179292 | 7/1996 |
| 2002/0140347 A1 | 10/2002 | Weaver | JP | 08325713 | 12/1996 |
| 2003/0038590 A1 | 2/2003 | Silvernail | JP | 09059763 | 3/1997 |
| 2003/0085652 A1 | 5/2003 | Weaver | JP | 09-161967 | 6/1997 |
| 2003/0098647 A1 | 5/2003 | Silvernail et al. | JP | 63136316 | 6/1998 |
| 2003/0124392 A1 | 7/2003 | Bright | JP | 11-040344 | 2/1999 |
| 2003/0127973 A1 | 7/2003 | Weaver et al. | JP | 11-255923 | 9/1999 |
| 2003/0197197 A1 | 10/2003 | Brown et al. | JP | 2000-058258 | 2/2000 |
| 2003/0218422 A1 | 11/2003 | Park et al. | JP | 2002/505969 | 2/2002 |
| 2004/0029334 A1 | 2/2004 | Bijker et al. | JP | 3579556 B2 | 10/2004 |
| 2004/0071971 A1 | 4/2004 | Lacovangelo | WO | WO 87 07848 | 12/1987 |
| 2004/0113542 A1 | 6/2004 | Hsiao et al. | WO | WO 95 10117 | 4/1995 |
| 2004/0115402 A1 | 6/2004 | Schaepkens | WO | WO 97 04885 | 2/1997 |
| 2004/0115859 A1 | 6/2004 | Murayama et al. | WO | WO 97/16053 | 5/1997 |
| 2004/0119028 A1 | 6/2004 | McCormick et al. | WO | WO 97 22631 | 6/1997 |
| 2004/0175512 A1 | 9/2004 | Schaepkens | WO | WO 98 10116 | 3/1998 |
| 2004/0175580 A1 | 9/2004 | Schaepkens | WO | WO 98 18852 | 5/1998 |
| 2004/0209090 A1 | 10/2004 | Iwanaga | WO | WO 99 16557 | 4/1999 |
| 2004/0219380 A1 | 11/2004 | Naruse et al. | WO | WO 99 16931 | 4/1999 |
| 2004/0229051 A1 | 11/2004 | Schaepkens et al. | WO | WO 99/46120 | 9/1999 |
| 2004/0241454 A1 | 12/2004 | Shaw et al. | WO | WO 00/36661 | 6/2000 |
| 2004/0263038 A1 | 12/2004 | Ribolzi et al. | WO | WO 00/36665 | 6/2000 |
| 2005/0003098 A1 | 1/2005 | Kohler et al. | WO | WO 01/81649 A1 | 11/2001 |
| 2005/0006786 A1 | 1/2005 | Sawada | WO | WO 01/82336 A2 | 11/2001 |
| 2005/0051094 A1 | 3/2005 | Schaepkens et al. | WO | WO 01/82389 A1 | 11/2001 |
| 2005/0079295 A1 | 4/2005 | Schaepkens | WO | WO 01/89006 A1 | 11/2001 |
| 2005/0079380 A1 | 4/2005 | Iwanaga | WO | WO 02/26973 A1 | 4/2002 |
| 2005/0093001 A1 | 5/2005 | Liu et al. | WO | WO 03/098716 A1 | 11/2003 |
| 2005/0093437 A1 | 5/2005 | Ouyang | WO | WO 2004/006199 A2 | 1/2004 |
| 2005/0094394 A1 | 5/2005 | Padiyath et al. | WO | WO 2004/016992 A1 | 2/2004 |
| 2005/0095736 A1 | 5/2005 | Padiyath et al. | WO | WO 2004/070840 A1 | 8/2004 |
| 2005/0112378 A1 | 5/2005 | Naruse et al. | WO | WO 2004/089620 A2 | 10/2004 |
| 2005/0122039 A1 | 6/2005 | Satani | WO | WO 2005/015655 A1 | 2/2005 |
| 2005/0129841 A1 | 6/2005 | McCormick et al. | WO | WO 2005/045947 A2 | 5/2005 |
| 2005/0133781 A1 | 6/2005 | Yan et al. | WO | WO 2005/048368 A1 | 5/2005 |
| 2005/0140291 A1 | 6/2005 | Hirakata et al. | WO | WO 2006/036492 A1 | 4/2006 |
| 2005/0146267 A1 | 7/2005 | Lee et al. | | | |
| 2005/0174045 A1 | 8/2005 | Lee et al. | | | |
| 2005/0212419 A1 | 9/2005 | Vazan et al. | | | |
| 2005/0238846 A1 | 10/2005 | Arakatsu et al. | | | |
| 2006/0003474 A1 | 1/2006 | Tyan et al. | | | |
| 2006/0028128 A1 | 2/2006 | Ohkubo | | | |
| 2006/0061272 A1 | 3/2006 | McCormick et al. | | | |
| 2006/0062937 A1 | 3/2006 | Padiyath et al. | | | |
| 2006/0063015 A1 | 3/2006 | McCormick et al. | | | |

FOREIGN PATENT DOCUMENTS

| | | |
|---|---|---|
| CA | 2353506 A1 | 5/2000 |
| DE | 19603746 | 4/1997 |
| DE | 696 15 510 T2 | 5/2002 |
| EP | 0 340 935 | 11/1989 |
| EP | 0 299 753 | 2/1993 |
| EP | 0 547 550 | 6/1993 |
| EP | 0 590 467 | 4/1994 |
| EP | 0 390 540 | 8/1994 |
| EP | 0 722 787 | 7/1996 |
| EP | 0 777 280 B1 | 6/1997 |
| EP | 0 777 281 A | 6/1997 |
| EP | 0 787 826 | 8/1997 |
| EP | 0 915 105 A1 | 5/1999 |
| EP | 0 916 394 | 5/1999 |
| EP | 0 931 850 | 7/1999 |
| EP | 0 977 469 | 2/2000 |
| EP | 1127 381 A1 | 8/2001 |
| EP | 1 278 244 A | 1/2003 |
| EP | 1 514 317 A1 | 3/2005 |
| JP | 64-18441 | 1/1989 |
| JP | 2-183230 | 7/1990 |
| JP | 3-290375 | 12/1991 |
| JP | 4-1440 | 4/1992 |

OTHER PUBLICATIONS

Shi, M.K., et al., Plasma treatment of PET and acrylic coating surfaces-I. In situ XPS measurements, Journal of Adhesion Science and Technology, Mar. 2000, 14(12), pp. 1-28.

Shi, M.K. et al., In situ and real-time monitoring of plasma-induced etching PET and acrylic films, Plasmas and Polymers, Dec. 1999, 4(4), pp. 1-25.

Affinito, J.D., et al., Vacuum Deposited Conductive Polymer Films, The Eleventh International Conference on Vacuum Web Coating, no earlier than Feb. 1998, pp. 200-213.

Mahon, J.K., et al., Requirements of Flexible Substrates for Organic Light Emitting Device in Flat Panel Display Applications, Society of Vacuum Coaters, 42nd Annual Technical Conference Proceedings, 1999, pp. 456-459.

Affinito, J.D. et al., Vacuum Deposited Conductive Polymer Films, The Eleventh International Conference on Vacuum Web Coating, pp. 1-12.

Affinito, J.D. et al., Vacuum deposited polymer/metal multi-layer films for optical application, Thin Solid Films 270, 1995, pts. 43-48.

Affinito, J.D. et al., "Molecularly Doped Polymer Composite Films for Light Emitting Polymer Applications Fabricated by the PML Process" 41st Technical Conference of Society of Vacuum Coaters, Apr. 1998, pp. 1-6.

Affinito, J.D. et al., "Vacuum Deposition of Polymer Electrolytes on Flexible Substrates" The Ninth International Conference on Vacuum Web Coating, pp. 0-16.

Brunshah, R.F. et al., "Deposition Technologies for Films and Coatings" Noyes Publications, Park Ridge, New Jersey, 1982, p. 339.

Affinito, J.D., Energy Res. Abstr. 18(6), #17171, 1993.

Czeremuszkin, G. et al., "Permeation Through Defects in Transparent Barrier Coated Plastic Films" 43rd Annual Technical Conference Proceedings, Apr. 15, 2000, pp. 408-413.

Vossen, J.L. et al., "Thin Film Processes" Academic Press, 1978, Part II, Chapter 11-1, Glow Discharge Sputter Deposition, pp. 12-63; Part IV, Chapter IV-1 Plasma Deposition of inorganic Thin Films, Chapter IV-2 Glow Discharge Polymerization, pp. 335-397.

Affinito, J.D. et al., "Ultra High Rate, Wide Area, Plasma Polymerized Films from High Molecular Weight/Low Vapor Pressure Liquid or Solid Monomer Precursors" 45th International Symposium of the American Vacuum Society, pp. 0-26.

G. Gustafason, et al., "Flexible Light-Emitting Diodes Made from Soluable Conducting Polymers" Letters of Nature, vol. 357, Jun. 11, 1992, pp. 477-479.

Tropsha et al., "Combinatorial Barrier Effect of the Multilayer SiOx Coatings on Polymer Substrates", 1997, Society of Vacuum Coaters, 40th Annual Technical Conferences Proceedings, pp. 64-69.

Tropsha et al., Activated Rate Theory Treatment of Oxygen and Water Transport through Silicon Oxide/Poly(ethylene terphthalate) Composit Barrier Structures; J. Phys. Chem B 1997 pp. 2259-2266.

F.M. Penning, "Electrical Discharges in Gases", 1965, pp. 1-50, Gordon and Breach, Science Publishers, New York-London Paris.

Affinito, J.D., et al., High Rate Vacuum Deposition of Polymer Electrolytes; Journal Vacuum Science Tehnology A 14(3), May/Jun. 1996.

Affinito, J.D. et al., Vacuum Deposited Polymer/metal Multilayer Films for Optical Applications, Paper No. C1.13, pp. 1-14.

Affinito, J.D. et al., Vacuum Deposition of Polymer Electrolytes on Flexible Substrates, The Ninth International Conference on Vacuum Web Coating, pp. 20-36.

Affinito, J.D. et al., Ultra High Rate, Wide Area, Plasma Polymerized Films from High Molecular Weight/Low Vapro Pressure Liquid or Solid Monomer Precursors, Journal Vacuum Science Technology A 17(4), Jul./Aug. 1999, pp. 1974-1981, American Vacuum Society.

Affinito, J.D. et al., Molecularly Doped Polymer Composite Films for Light Emitting Polymer Application Fabircated by the PML Process, 41st Technical Conference of the Society of Vacuum Coaters, 1998, pp. 220-225.

Affinito, J.D. et al., Polymer/Polymer, Polymer/Oxide, and Polymer/Metal Deposited Interference Filters, Tenth International Vacuum Web Coating Conference, pp. 0-14.

Felts, J.T., Transparent Barrier Coatings Updated: Flexible Substrates, pp. 324-331.

Henry, B.M. et al.; Microstructural and Gas Barrier Properties of Teansparent Aluminium Oxide and Indium Tin Oxide Films; 2000; pp. 373-378; Society of Vacuum Coaters.

Phillips, R.W.; Evaporated Dielectric Colorless Films on PET and Opp Exhibiting High Barriers Toward Moisture and Oxygen; Society of Vacuum Coaters; 36th Annual Technical Conference Proceedings; 1993; pp. 293-300.

Yamada, Y. et al.; The Properties of a New Transparent and Colorless Barrier Film; 1995; pp. 28-31; Society of Vacuum Coaters.

Chahroudi, D.; Transparent Glass Barrier Coatings for Flexible Film Packaging: 1991; pp. 130-133; Society of Vacuum Coaters.

Bright, Clark, I.; Transparent Barrier Coatings Based on ITO for Flexible Plastic Displays; pp. 247-255.

Henry, B.M. et al.; Microstructural Studies of Transparent Gas Barrier Coatings on Polymer Substrates; pp. 265-273.

Hibino, N. et al.; Transparent Barrier Al203 Coating By Activated Reactive Evaporation; pp. 234-245.

Kukla, R. et al.; Transparent Barrier Coatings with EB-Evaporation, an Update; Section Five; Transparent Barrier Coating-Papers; pp. 222-233.

Krug, T. et al.; New Developments in Transparent Barrier Coatings; 1993; pp. 302-305; Society Vacuum Coaters.

Affinito, J.D. et al.; PML/Oxide/PML Barrier Layer Performance Differences Arising From $_{Jse}$ Use Of UV or Electron Beam Polymerization of the PML Layers; Thin Solid Films; Elsevier Science S.A.; vol. 308-309; Oct. 31, 1997, pp. 19-25.

Affinito, J.D. et al.; A new method for fabricating transparent barrier layers, Thin Solid Films 290-291; 1996; pp. 63-67.

Affinito, J.D. et al.; Polymer-Oxide Transparent Barrier Layers; SVC 39th Annual Technical Conference; Vacuum Web Coating Session; 1996; pp. 392-397.

Hoffmann, G. et al.; Transparent Barrier Coatings by Reactive Evaporation; 1994; pp. 155-160; Society of Vacuum Coaters.

Norenberg, H. et al.; Comparative Study of Oxygen Permeation Through Polymers and Gas Barrier Films; 2000; pp. 347-351; Society of Vacuum Coaters.

Yializis, A. et al.; Ultra High Barrier Films; 2000; pp. 404-407; Society Vacuum Coaters.

Klemberg-Sapieha, J.E. et al.; Transparent Gas Barrier Coatings Produced by Dual-Frequency PECVD; 1993; pp. 445-449; Society of Vacuum Coaters.

Finson, E. et al.; Transparent SiO2 Barrier Coatings: Conversion and Production Status; 1994; pp. 139-143; Society of Vacuum Coaters.

Yializis, A. et al.; High Oxygen Barrier Polypropylene Films Using Transparent Acrylate-A203 and Opaque Al-Acrylate Coatings; 1995; pp. 95-102; Society of Vacuum Coaters.

Shaw, D.G. et al.; Use of Vapor Deposited Acrylate Coatings to Improve the Barrier Properties of Metalized Film; 1994; pp. 240-244; Society of Vacuum Coaters.

* cited by examiner

METHOD FOR EDGE SEALING BARRIER FILMS

This application is a continuation-in-part of application Ser. No. 11/068,356, filed Feb. 28, 2005, entitled Method for Edge Sealing Barrier Films, which is a division of application Ser. No. 09/966,163, filed Sep. 28, 2001, entitled Method for Edge Sealing Barrier Films, now U.S. Pat. No. 6,866,901, which is a continuation-in-part of application Ser. No. 09/427,138, filed Oct. 25, 1999, entitled Environmental Barrier Material for Organic Light Emitting Device and Method of Making, now U.S. Pat. No. 6,522,067.

BACKGROUND OF THE INVENTION

The invention relates generally to multilayer, thin film barrier composites, and more particularly, to multilayer, thin film barrier composites having the edges sealed against lateral moisture and gas diffusion.

Multilayer, thin film barrier composites having alternating layers of barrier material and polymer material are known. These composites are typically formed by depositing alternating layers of barrier material and polymer material, such as by vapor deposition. If the polymer layers are deposited over the entire surface of the substrate, then the edges of the polymer layers are exposed to oxygen, moisture, and other contaminants. This potentially allows the moisture, oxygen, or other contaminants to diffuse laterally into an encapsulated environmentally sensitive device from the edge of the composite, as shown in FIG. 1. The multilayer, thin film barrier composite 100 includes a substrate 105 and alternating layers of decoupling material 110 and barrier material 115. The scale of FIG. 1 is greatly expanded in the vertical direction. The area of the substrate 105 will typically vary from a few square centimeters to several square meters. The barrier layers 115 are typically a few hundred Angstroms thick, while the decoupling layers 110 are generally less than ten microns thick. The lateral diffusion rate of moisture and oxygen is finite, and this will eventually compromise the encapsulation. One way to reduce the problem of edge diffusion is to provide long edge diffusion paths. However, this decreases the area of the substrate which is usable for active environmentally sensitive devices. In addition, it only lessens the problem, but does not eliminate it.

A similar edge diffusion problem will arise when a substrate containing a multilayer, thin film barrier composite is scribed and separated to create individual components.

SUMMARY OF THE INVENTION

Thus, there is a need for an edge-sealed barrier film composite, and for a method of making such a composite.

The present invention solves this need by providing an edge-sealed, encapsulated environmentally sensitive device. The edge-sealed, environmentally sensitive device includes at least one initial barrier stack comprising at least one decoupling layer and at least one barrier layer. A first decoupling layer of a first initial barrier stack has an area and a first barrier layer of the first initial barrier stack has an area, the area of the first barrier layer of the first initial barrier stack being greater than the area of the first decoupling layer of the first initial barrier stack. The first barrier layer of the first initial barrier stack is in contact with a third barrier layer or an optional substrate, sealing the first decoupling layer of the first initial barrier stack between the first barrier layer of the first initial barrier stack and the third barrier layer or the optional substrate. An environmentally sensitive device is adjacent to the at least one initial barrier stack. At least one additional barrier stack is adjacent to the environmentally sensitive device on a side opposite the at least one initial barrier stack. The at least one additional barrier stack comprises at least one decoupling layer and at least one barrier layer. A first decoupling layer of a first additional barrier stack has an area and a first barrier layer of the first additional barrier stack has an area, the area of the first barrier layer of the first additional barrier stack being greater than the area of the first decoupling layer of the first additional barrier stack. The first barrier layer of the first additional barrier stack is in contact with a fourth barrier layer, sealing the first decoupling layer of the first additional barrier stack between the first barrier layer of the first additional barrier stack and the fourth barrier layer. At least one barrier layer of at least one initial barrier stack is in contact with at least one barrier layer of at least one additional barrier stack, sealing the environmentally sensitive device between the at least one initial barrier stack and the at least one additional barrier stack forming an environmentally sensitive device seal, wherein an oxygen transmission rate through the environmentally sensitive device seal is less than 0.005 $cc/m^2/day$ at 23° C. and 0% relative humidity.

By adjacent, we mean next to, but not necessarily directly next to. There can be additional layers intervening between the substrate and the barrier stacks, and between the barrier stacks and the environmentally sensitive device, etc.

Another aspect of the invention is a method of making an edge-sealed, encapsulated environmentally sensitive device. The method includes providing at least one initial barrier stack, the at least one initial barrier stack comprising at least one decoupling layer and at least one barrier layer, wherein a first decoupling layer of a first initial barrier stack has an area and wherein a first barrier layer of the first initial barrier stack has an area, the area of the first barrier layer of the first initial barrier stack being greater than the area of the first decoupling layer of the first initial barrier stack, and wherein the first barrier layer of the first initial barrier stack is in contact with a third barrier layer or an optional substrate, sealing the first decoupling layer of the first initial barrier stack between the first barrier layer of the first initial barrier stack and the third barrier layer or the optional substrate; placing an environmentally sensitive device adjacent to the at least one initial barrier stack; and placing at least one additional barrier stack adjacent to the environmentally sensitive device on a side opposite the at least one initial barrier stack, the at least one additional barrier stack comprising at least one decoupling layer and at least one barrier layer, wherein a first decoupling layer of a first additional barrier stack has an area and wherein a first barrier layer of the first additional barrier stack has an area, the area of the first barrier layer of the first additional barrier stack being greater than the area of the first decoupling layer of the first additional barrier stack, wherein the first barrier layer of the first additional barrier stack is in contact with a fourth barrier layer, sealing the first decoupling layer of the first additional barrier stack between the first barrier layer of the first additional barrier stack and the fourth barrier layer, and wherein at least one barrier layer of at least one initial barrier stack is in contact with at least one barrier layer of at least one additional barrier stack, sealing the environmentally sensitive device between the at least one initial barrier stack and the at least one additional barrier stack forming an environmentally sensitive device seal, wherein an oxygen transmission rate through the environmentally sensitive device seal is less than 0.005 cc/m²/day at 23° C. and 0% relative humidity.

DETAILED DESCRIPTION OF THE INVENTION

Figure 1:
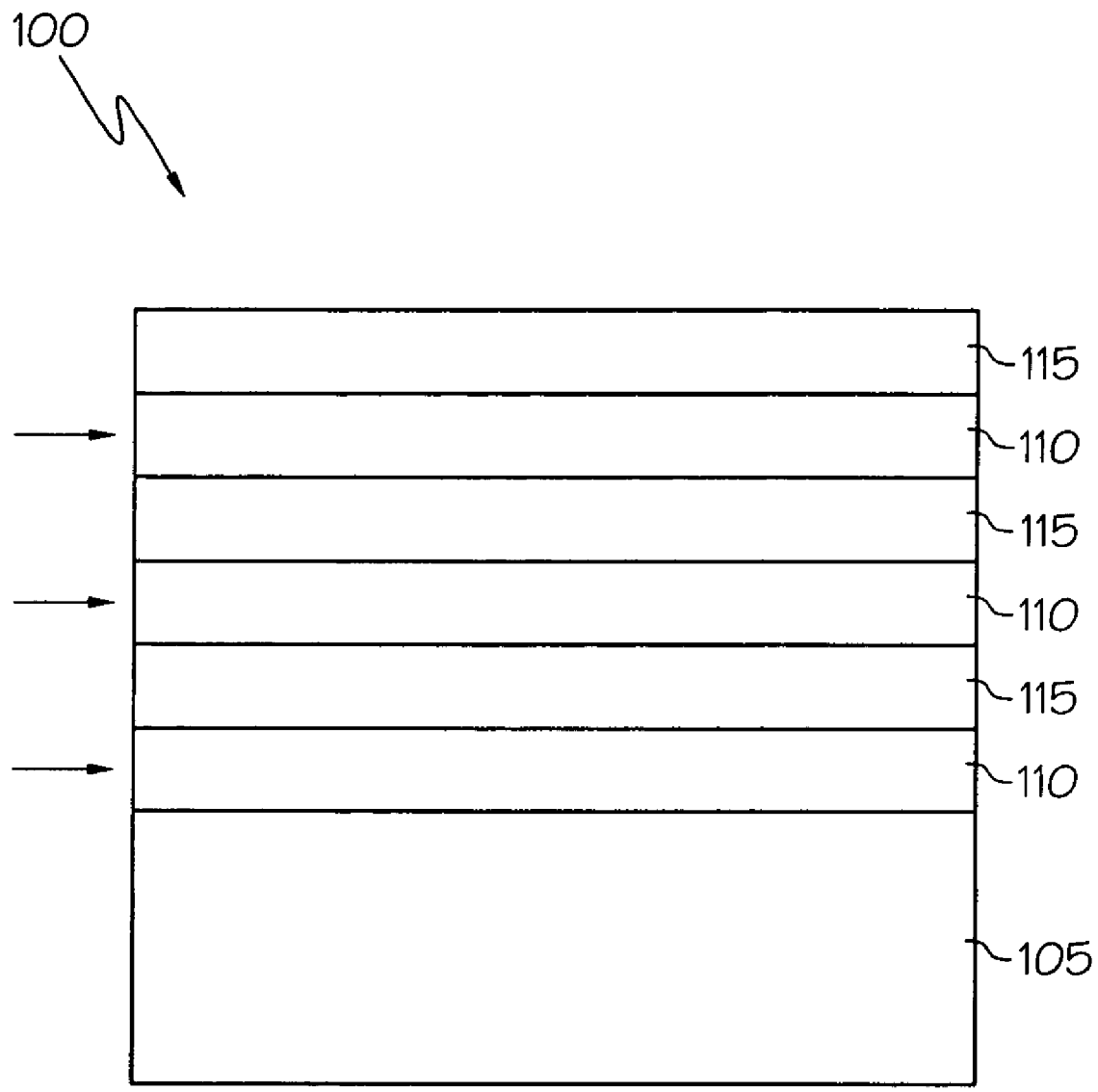
FIG. 1 is a cross-section of a barrier composite of the prior art.
Figure 2:
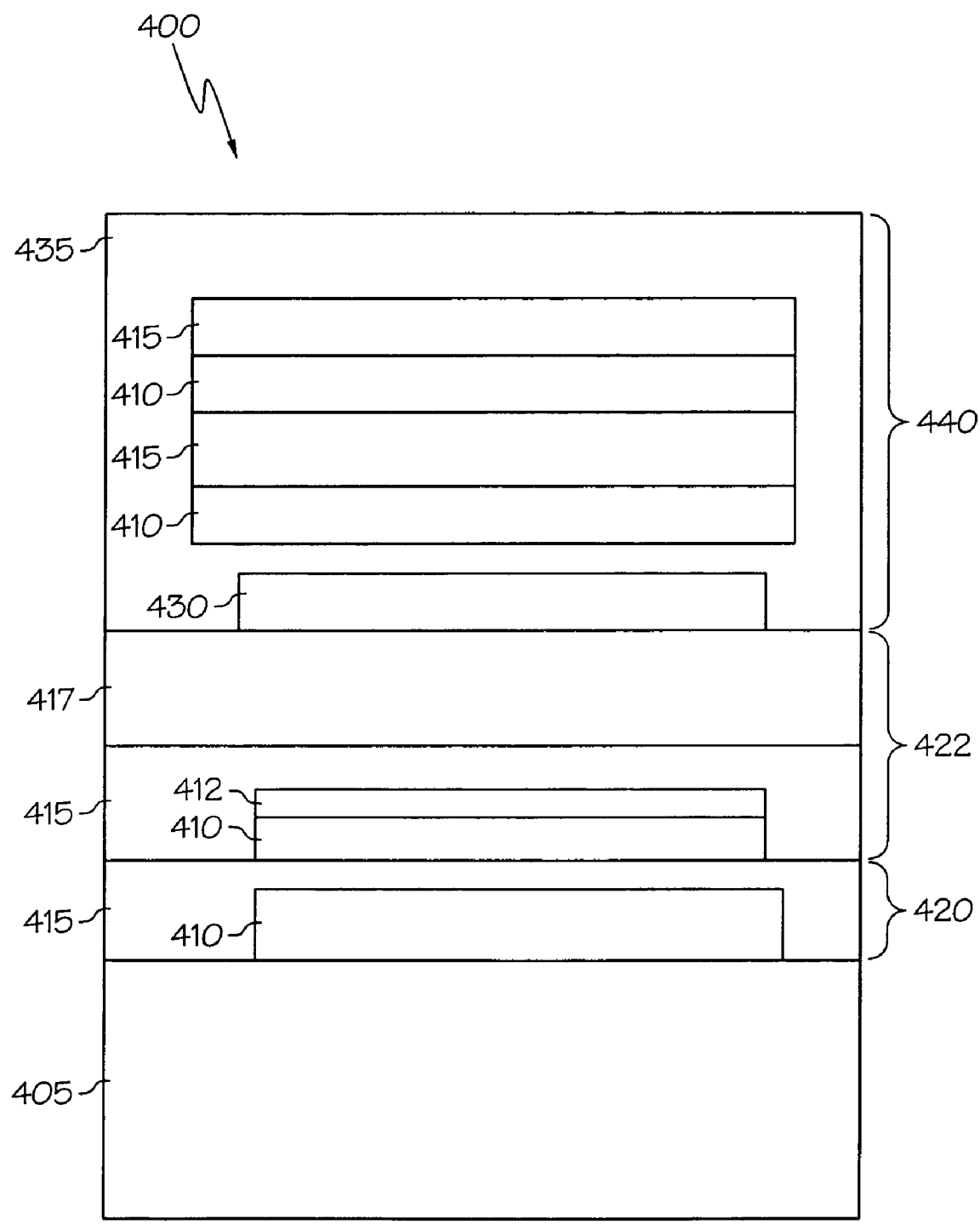
FIG. 2 is a cross-section of one embodiment of an edge-sealed, encapsulated environmentally sensitive device of the present invention.

FIG. 2 shows an edge-sealed, encapsulated environmentally sensitive device 400. There is a substrate 405 which can be removed after the device is made, if desired. The environmentally sensitive device 430 is encapsulated between initial barrier stack 422 on one side and additional barrier stack 440 on the other side. There is another initial barrier stack 420 between the substrate 405 and initial barrier stack 422.

The environmentally sensitive device can be any device requiring protection from moisture, gas, or other contaminants. Environmentally sensitive devices include, but are not limited to, organic light emitting devices, liquid crystal displays, displays using electrophoretic inks, light emitting diodes, light emitting polymers, electroluminescent devices, phosphorescent devices, organic solar cells, inorganic solar cells, thin film batteries, and thin film devices with vias, and combinations thereof.

The substrate, which is optional, can be any suitable substrate, and can be either rigid or flexible. Suitable substrates include, but are not limited to: polymers, for example, polyethylene terephthalate (PET), polyethylene naphthalate (PEN), or high temperature polymers, such as polyether sulfone (PES), polyimides, or Transphan™ (a high glass transition temperature cyclic olefin polymer available from Lofo High Tech Film, GMBH of Weil am Rhein, Germany); metals and metal foils; paper; fabric; glass, including thin, flexible, glass sheet (for example, flexible glass sheet available from Corning Inc. under the glass code 0211. This particular thin, flexible glass sheet has a thickness of less than 0.6 mm and will bend at a radium of about 8 inches.); ceramics; semiconductors; silicon; and combinations thereof.

Barrier stack 420 has a barrier layer 415 which has an area greater than the area of the decoupling layer 410 which seals the decoupling layer 410 within the area of the barrier layer 415. Barrier stack 422 has two barrier layers 415, 417 and two decoupling layers 410, 412. Barrier layer 415 has an area greater than that of the decoupling layers 410, 412 which seals the decoupling layers 410, 412 within the area of the barrier layer 415. There is a second barrier layer 417.

Because the decoupling layers 410, 412 are sealed within the area covered by the barrier layer 415, ambient moisture, oxygen, and other contaminants cannot diffuse through the decoupling layers to the environmentally sensitive device.

On the other side of the environmentally sensitive device 430, there is an additional barrier stack 440. Barrier stack 440 includes two decoupling layers 410 and two barrier layers 415 which may be of approximately the same size. Barrier stack 440 also includes barrier layer 435 which has an area greater than the area of the decoupling layers 410 which seals the decoupling layers 410 within the area of barrier layer 435.

It is not required that all of the barrier layers have an area greater than all of the decoupling layers, but at least one of the barrier layers must have an area greater than at least one of the decoupling layers. If not all of the barrier layers have an area greater than of the decoupling layers, the barrier layers which do have an area greater than the decoupling layers should form a seal around those which do not so that there are no exposed decoupling layers within the barrier composite, although, clearly it is a matter of degree. The fewer the edge areas of decoupling layers exposed, the less the edge diffusion. If some diffusion is acceptable, then a complete barrier is not required.

The barrier stacks of the present invention on polymeric substrates, such as PET, have measured oxygen transmission rate (OTR) and water vapor transmission rate (WVTR) values well below the detection limits of current industrial instrumentation used for permeation measurements (Mocon OxTran 2/20L and Permatran). Table 1 shows the OTR and WVTR values (measured according to ASTM F 1927-98 and ASTM F 1249-90, respectively) measured at Mocon (Minneapolis, Minn.) for several barrier stacks on 7 mil PET, along with reported values for other materials.

TABLE 1

| Sample | Oxygen Permeation Rate (cc/m²/day) | | Water Vapor Permeation (g/m²/day)[+] | |
|---|---|---|---|---|
| | 23° C. | 38° C. | 23° C. | 38° C. |
| Native 7 mil PET | 7.62 | — | — | — |
| 1-barrier stack | <0.005 | <0.005* | — | 0.46[+] |
| 1-barrier stack with ITO | <0.005 | <0.005* | — | 0.011[+] |
| 2-barrier stacks | <0.005 | <0.005* | — | <0.005[+] |
| 2-barrier stacks with ITO | <0.005 | <0.005* | — | <0.005[+] |
| 5-barrier stacks | <0.005 | <0.005* | — | <0.005[+] |
| 5-barrier stacks with ITO | <0.005 | <0.005* | — | <0.005[+] |
| DuPont film[1] (PET/Si$_3$N$_4$ or PEN/Si$_3$N$_4$) | 0.3 | — | — | — |
| Polaroid[3] | <1.0 | — | — | — |
| PET/Al[2] | 0.6 | — | 0.17 | — |
| PET/silicon oxide[2] | 0.7–1.5 | — | 0.15–0.9 | — |
| Teijin LCD film (HA grade - TN/STN)[3] | <2 | — | <5 | — |

*38° C., 90% RH, 100% O$_2$
[+]38° C., 100% RH
[1]P. F. Carcia, 46th International Symposium of the American Vacuum Society, Oct. 1999
[2]Langowski, H. C., 39th Annual Technical Conference Proceedings, SVC, pp. 398–401 (1996)
[3]Technical Data Sheet As the data in Table 1 shows, the barrier stacks of the present invention provide oxygen and water vapor permeation rates several orders of magnitude better than PET coated with aluminum, silicon oxide, or aluminum oxide. Typical oxygen permeation rates for other barrier coatings range from about 1 to about 0.1 cc/m²/day. The oxygen transmission rate for the barrier stacks of the present invention is less than 0.005 cc/m²/day at 23° C. and 0% relative humidity, and at 38° C. and 90% relative humidity. The water vapor transmission rate is less than 0.005 g/m²/day at 38° C. and 100% relative humidity. The actual transmission rates are lower, but cannot be measured with existing equipment.

In theory, a good edge seal should be no more permeable than the overall barrier layer. This should result in failure at the edges occurring at a rate statistically the same as that observed anywhere else. In practice, the areas closest to the edge show failure first, and the inference is that edge failure is involved.

The Mocon test for the barrier layers requires significant surface area, and cannot be used to test the edge seal directly. A test using a layer of calcium was developed to measure barrier properties. The calcium test is described in Nisato et al., "Thin Film Encapsulation for OLEDs: Evaluation of Multi-layer Barriers using the Ca Test," SID 03 Digest, 2003, p. 550–553, which is incorporated herein by reference. The calcium test can be used to evaluate edge seal performance for both oxygen transmission rate and water vapor transmission rate. An encapsulated device is made, and the edges are observed for degradation in response to permeation by oxygen and water. The determination is qualitative: pass/fail. Failure is noted at the edges, and the failure progresses inwards from the edges over time. An edge seal which passes the calcium test has an oxygen transmission rate for the edge seal of less than 0.005 cc/m²/day at 23° C. and 0% relative humidity, and at 38° C. and 90% relative humidity. It would also have a water vapor transmission rate of less than 0.005 g/m²/day at 38° C. and 100% relative humidity.

Figure 5:
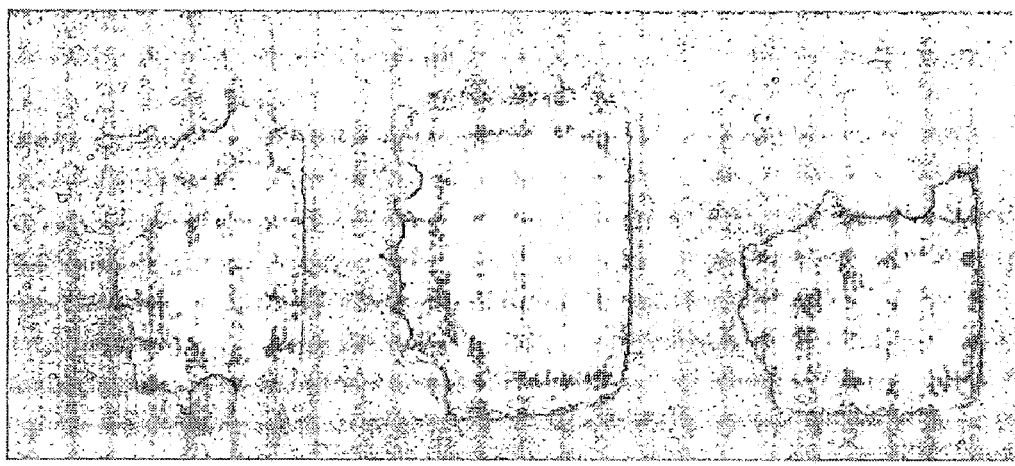
FIG. 5 shows a failed edge seal after 750 hours at 60° C. and 90% relative humidity.
Figure 4:
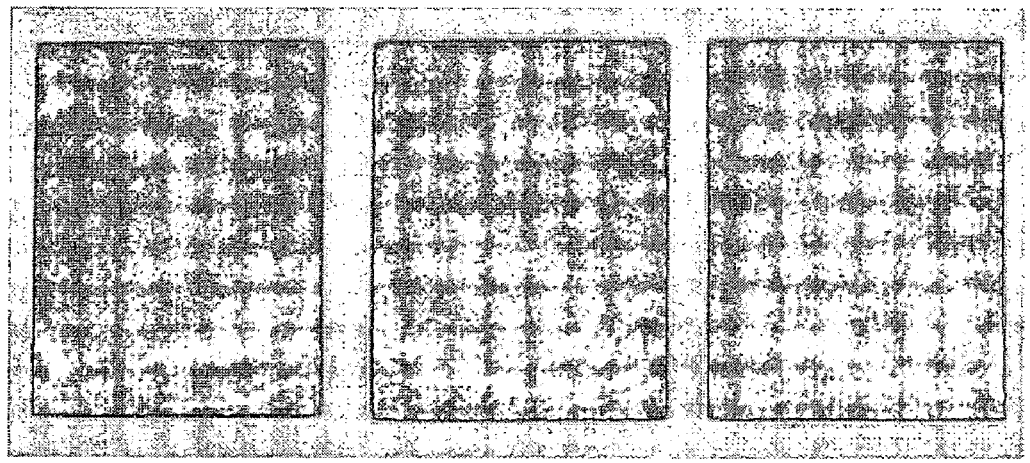
FIG. 4 shows a successful edge seal after 750 hours at 60° C. and 90% relative humidity.
Figure 3:
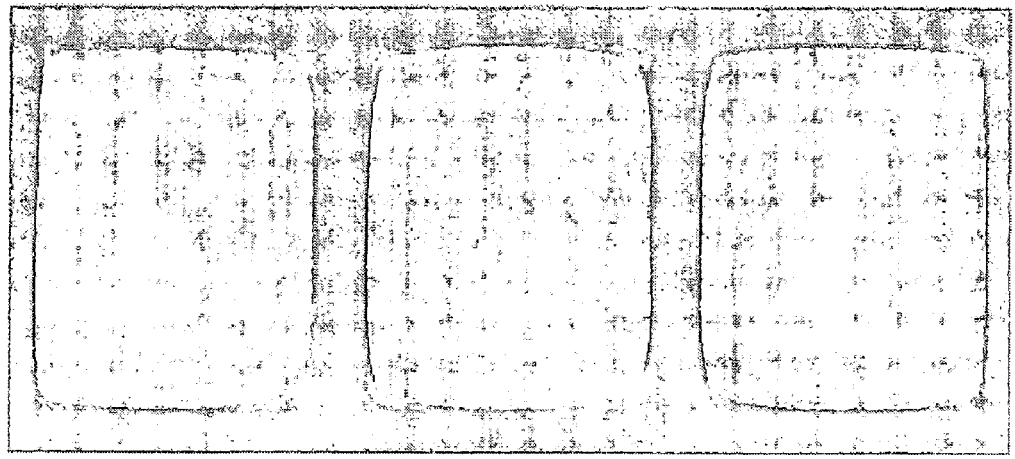
FIG. 3 shows a successful barrier layer without a seal after 750 hours at 60° C. and 90% relative humidity.

FIGS. 3–5 show results from calcium tests after 750 hours at 60° C. and 90% relative humidity. FIG. 3 shows a successful barrier layer without a seal. The edge of the barrier layer is more than 50 mm from the calcium edge. FIG. 4 shows a successful edge seal. The edge of the barrier layer is 3 mm from the calcium edge, and no degradation is observed. FIG. 5 shows an edge seal which failed. The edge of the barrier layer is 3 mm from the calcium edge, and severe degradation can be seen.

The number of barrier stacks is not limited. The number of barrier stacks needed depends on the substrate material used and the level of permeation resistance needed for the particular application. One or two barrier stacks may provide sufficient barrier properties for some applications. The most stringent applications may require five or more barrier stacks.

The barrier stacks can have one or more decoupling layers and one or more barrier layers. There could be one decoupling layer and one barrier layer, there could be one or more decoupling layers on one side of one or more barrier layers, there could be one or more decoupling layers on both sides of one or more barrier layers, or there could be one or more barrier layers on both sides of one or more decoupling layers. The important feature is that the barrier stack have at least one decoupling layer and at least one barrier layer. The barrier layers in the barrier stacks can be made of the same material or of a different material, as can the decoupling layers. The barrier layers are typically about 100–400 Å thick, and the decoupling layers are typically about 1000–10,000 Å thick.

The barrier stacks can have the same or different layers, and the layers can be in the same or different sequences.

If there is only one barrier stack and it has only one decoupling layer and one barrier layer, then the decoupling layer must be first in order for the barrier layer to seal it. The decoupling layer will be sealed between the substrate (or the upper layer of the previous barrier stack) and the barrier layer. Although a device can be made with a single barrier stack having one decoupling layer and one barrier layer on each side of the environmentally sensitive device, there will typically be at least two barrier stacks on each side, each stack having one (or more) decoupling layer and one (or more) barrier layer. In this case, the first layer in the stack can be either a decoupling layer or a barrier layer, as can the last layer.

The barrier layer which seals the decoupling layer may be the first barrier layer in the barrier stack, as shown in barrier stack 420. It may also be a second (or later) barrier layer as shown in barrier stack 440. Barrier layer 435 which seals the barrier stack 440 is the third barrier layer in the barrier stack following two barrier layers 415 which do not seal the barrier stack. Thus, the use of the terms first decoupling layer and first barrier layer in the claims does not refer to the actual sequence of layers, but to layers which meet the limitations. Similarly, the terms first initial barrier stack and first additional barrier stack do not refer to the actual sequence of the initial and additional barrier stacks.

The decoupling layers may be made from the same decoupling material or different decoupling material. The decoupling layer can be made of any suitable decoupling material, including, but not limited to, organic polymers, inorganic polymers, organometallic polymers, hybrid organic/inorganic polymer systems, silicates, and combinations thereof. Organic polymers include, but are not limited to, urethanes, polyamides, polyimides, polybutylenes, isobutylene isoprene, polyolefins, epoxies, parylenes, benzocyclobutadiene, polynorbornenes, polyarylethers, polycarbonates, alkyds, polyaniline, ethylene vinyl acetate, ethylene acrylic acid, and combinations thereof. Inorganic polymers include, but are not limited to, silicones, polyphosphazenes, polysilazanes, polycarbosilanes, polycarboranes, carborane siloxanes, polysilanes, phosphonitriles, sulfur nitride polymers, siloxanes, and combinations thereof. Organometallic polymers include, but are not limited to, organometallic polymers of main group metals, transition metals, and lanthanide/actinide metals, or combinations thereof. Hybrid organic/inorganic polymer systems include, but are not limited to, organically modified silicates, preceramic polymers, polyimide-silica hybrids, (meth)acrylate-silica hybrids, polydimethylsiloxane-silica hybrids, ceramers, and combinations thereof.

The barrier layers may be made from the same barrier material or different barrier material. The barrier layer can be made from any suitable barrier material. The barrier material can be transparent or opaque depending on what the composite is to be used for. Suitable barrier materials include, but are not limited to, metals, metal oxides, metal nitrides, metal carbides, metal oxynitrides, metal oxyborides, and combinations thereof. Metals include, but are not limited to, aluminum, titanium, indium, tin, tantalum, zirconium, niobium, hafnium, yttrium, nickel, tungsten, chromium, zinc, alloys thereof, and combinations thereof. Metal oxides include, but are not limited to, silicon oxide, aluminum oxide, titanium oxide, indium oxide, tin oxide, indium tin oxide, tantalum oxide, zirconium oxide, niobium oxide, hafnium oxide, yttrium oxide, nickel oxide, tungsten oxide, chromium oxide, zinc oxide, and combinations thereof. Metal nitrides include, but are not limited to, aluminum nitride, silicon nitride, boron nitride, germanium nitride, chromium nitride, nickel nitride, and combinations thereof. Metal carbides include, but are not limited to, boron carbide, tungsten carbide, silicon carbide, and combinations thereof.

Metal oxynitrides include, but are not limited to, aluminum oxynitride, silicon oxynitride, boron oxynitride, and combinations thereof. Metal oxyborides include, but are limited to, zirconium oxyboride, titanium oxyboride, and combinations thereof. Suitable barrier materials also include, but are not limited to, opaque metals, opaque ceramics, opaque polymers, and opaque cermets, and combinations thereof. Opaque cermets include, but are not limited to, zirconium nitride, titanium nitride, hafnium nitride, tantalum nitride, niobium nitride, tungsten disilicide, titanium diboride, and zirconium diboride, and combinations thereof.

The barrier layers may be deposited by any suitable process including, but not limited to, conventional vacuum processes such as sputtering, evaporation, sublimation, chemical vapor deposition (CVD), plasma enhanced chemical vapor deposition (PECVD), electron cyclotron resonance-plasma enhanced vapor deposition (ECR-PECVD), and combinations thereof.

The decoupling layer can be produced by a number of known processes which provide improved surface planarity, including both atmospheric processes and vacuum processes. The decoupling layer may be formed by depositing a layer of liquid and subsequently processing the layer of liquid into a solid film. Depositing the decoupling layer as a liquid allows the liquid to flow over the defects in the substrate or previous layer, filling in low areas, and covering up high points, providing a surface with significantly improved planarity. When the decoupling layer is processed into a solid film, the improved surface planarity is retained. Suitable processes for depositing a layer of liquid material and processing it into a solid film include, but are not limited to, vacuum processes and atmospheric processes. Suitable vacuum processes include, but are not limited to, those described in U.S. Pat. Nos. 5,260,095, 5,395,644, 5,547,508, 5,691,615, 5,902,641, 5,440,446, and 5,725,909, which are incorporated herein by reference. The liquid spreading apparatus described in U.S. Pat. Nos. 5,260,095, 5,395,644, and 5,547,508 can be further configured to print liquid monomer in discrete, precisely placed regions of the receiving substrate.

Suitable atmospheric processes include, but are not limited to, spin coating, printing, ink jet printing, and/or spraying. By atmospheric processes, we mean processes run at pressures of about 1 atmosphere that can employ the ambient atmosphere. The use of atmospheric processes presents a number of difficulties including the need to cycle between a vacuum environment for depositing the barrier layer and ambient conditions for the decoupling layer, and the exposure of the environmentally sensitive device to environmental contaminants, such as oxygen and moisture. One way to alleviate these problems is to use a specific gas (purge gas) during the atmospheric process to control exposure of the receiving substrate to the environmental contaminants. For example, the process could include cycling between a vacuum environment for barrier layer deposition and an ambient pressure nitrogen environment for the atmospheric process. Printing processes, including ink jet printing, allow the deposition of the decoupling layer in a precise area without the use of masks.

One way to make a decoupling layer involves depositing a polymer precursor, such as a (meth)acrylate containing polymer precursor, and then polymerizing it in situ to form the decoupling layer. As used herein, the term polymer precursor means a material which can be polymerized to form a polymer, including, but not limited to, monomers, oligomers, and resins. As another example of a method of making a decoupling layer, a preceramic precursor could be deposited as a liquid by spin coating and then converted to a solid layer. Full thermal conversion is possible for a film of this type directly on a glass or oxide coated substrate. Although it cannot be fully converted to a ceramic at temperatures compatible with some flexible substrates, partial conversion to a cross-lined network structure would be satisfactory. Electron beam techniques could be used to crosslink and/or densify some of these types of polymers and can be combined with thermal techniques to overcome some of the substrate thermal limitations, provided the substrate can handle the electron beam exposure. Another example of making a decoupling layer involves depositing a material, such as a polymer precursor, as a liquid at a temperature above its melting point and subsequently freezing it in place.

One method of making the composite of the present invention includes providing a substrate, and depositing a barrier layer adjacent to the substrate at a barrier deposition station. The substrate with the barrier layer is moved to a decoupling material deposition station. A mask is provided with an opening which limits the deposition of the decoupling layer to an area which is smaller than, and contained within, the area covered by the barrier layer. The first layer deposited could be either the barrier layer or the decoupling layer, depending on the design of the composite.

In order to encapsulate multiple small environmentally sensitive devices contained on a single large motherglass, the decoupling material may be deposited through multiple openings in a single shadow mask, or through multiple shadow masks. This allows the motherglass to be subsequently diced into individual environmentally sensitive devices, each of which is edge sealed.

For example, the mask may be in the form of a rectangle with the center removed (like a picture frame). The decoupling material is then deposited through the opening in the mask. The layer of decoupling material formed in this way will cover an area less than the area covered by the layer of barrier material. This type of mask can be used in either a batch process or a roll coating process operated in a step and repeat mode. With these processes, all four edges of the decoupling layer will be sealed by the barrier material when a second barrier layer which has an area greater than the area of the decoupling layer is deposited over the decoupling layer.

The method can also be used in a continuous roll to roll process using a mask having two sides which extend inward over the substrate. The opening is formed between the two sides of the mask which allows continuous deposition of decoupling material. The mask may have transverse connections between the two sides so long as they are not in the deposition area for the decoupling layer. The mask is positioned laterally and at a distance from the substrate so as to cause the decoupling material to be deposited over an area less than that of the barrier layer. In this arrangement, the lateral edges of the decoupling layer are sealed by the barrier layer.

The substrate can then be moved to a barrier deposition station (either the original barrier deposition station or a second one), and a second layer of barrier material deposited on the decoupling layer. Since the area covered by the first barrier layer is greater than the area of the decoupling layer, the decoupling layer is sealed between the two barrier layers. These deposition steps can be repeated if necessary until sufficient barrier material is deposited for the particular application.

When one of the barrier stacks includes two or more decoupling layers, the substrate can be passed by one or more decoupling material deposition stations one or more times before being moved to the barrier deposition station. The decoupling layers can be made from the same decoupling material or different decoupling material. The decoupling layers can be deposited using the same process or using different processes.

Similarly, one or more barrier stacks can include two or more barrier layers. The barrier layers can be formed by passing the substrate (either before or after the decoupling layers have been deposited) past one or more barrier deposition stations one or more times, building up the number of layers desired. The layers can be made of the same or different barrier material, and they can be deposited using the same or different processes.

In another embodiment, the method involves providing a substrate and depositing a layer of barrier material on the surface of the substrate at a barrier deposition station. The substrate with the barrier layer is moved to a decoupling material deposition station where a layer of decoupling material is deposited over substantially the whole surface of the barrier layer. A solid mask is then placed over the substrate with the barrier layer and the decoupling layer. The mask protects the central area of the surface, which would include the areas covered by the active environmentally sensitive devices. A reactive plasma can be used to etch away the edges of the layer of decoupling material outside the mask, which results in the layer of etched decoupling material covering an area less than the area covered by the layer of barrier material. Suitable reactive plasmas include, but are not limited to, $O_2$, $CF_4$, and $H_2$, and combinations thereof. A layer of barrier material covering an area greater than that covered by the etched decoupling layer can then be deposited, sealing the etched decoupling layer between the layers of barrier material.

To ensure good coverage of the edge of the decoupling layer by the barrier layer, techniques for masking and etching the decoupling layer to produce a feathered edge, i.e., a gradual slope instead of a sharp step, may be employed. Several such techniques are known to those in the art, including, but not limited to, standing off the mask a short distance above a polymer surface to be etched.

The deposition and etching steps can be repeated until sufficient barrier material is deposited. This method can be used in a batch process or in a roll coating process operated in a step and repeat mode. In these processes, all four edges of the decoupling layer may be etched. This method can also be used in continuous roll to roll processes. In this case, only the edges of the decoupling material in the direction of the process are etched.

Alternatively, two masks can be used, one for the decoupling material and one for the barrier material. This would allow encapsulation with an edge seal of device which has electrical contacts which extend outside the encapsulation. The electrical contacts can remain uncoated (or require only minimal post-encapsulation cleaning.) The electrical contacts will typically be thin layer constructions that are sensitive to post-encapsulation cleaning or may be difficult to expose by selective etching of the encapsulation. In addition, if a mask is applied only for the decoupling material, a thick barrier layer could extend over the areas between the devices and cover the contacts. Furthermore, cutting through the thick barrier layer could be difficult.

Figure 6:
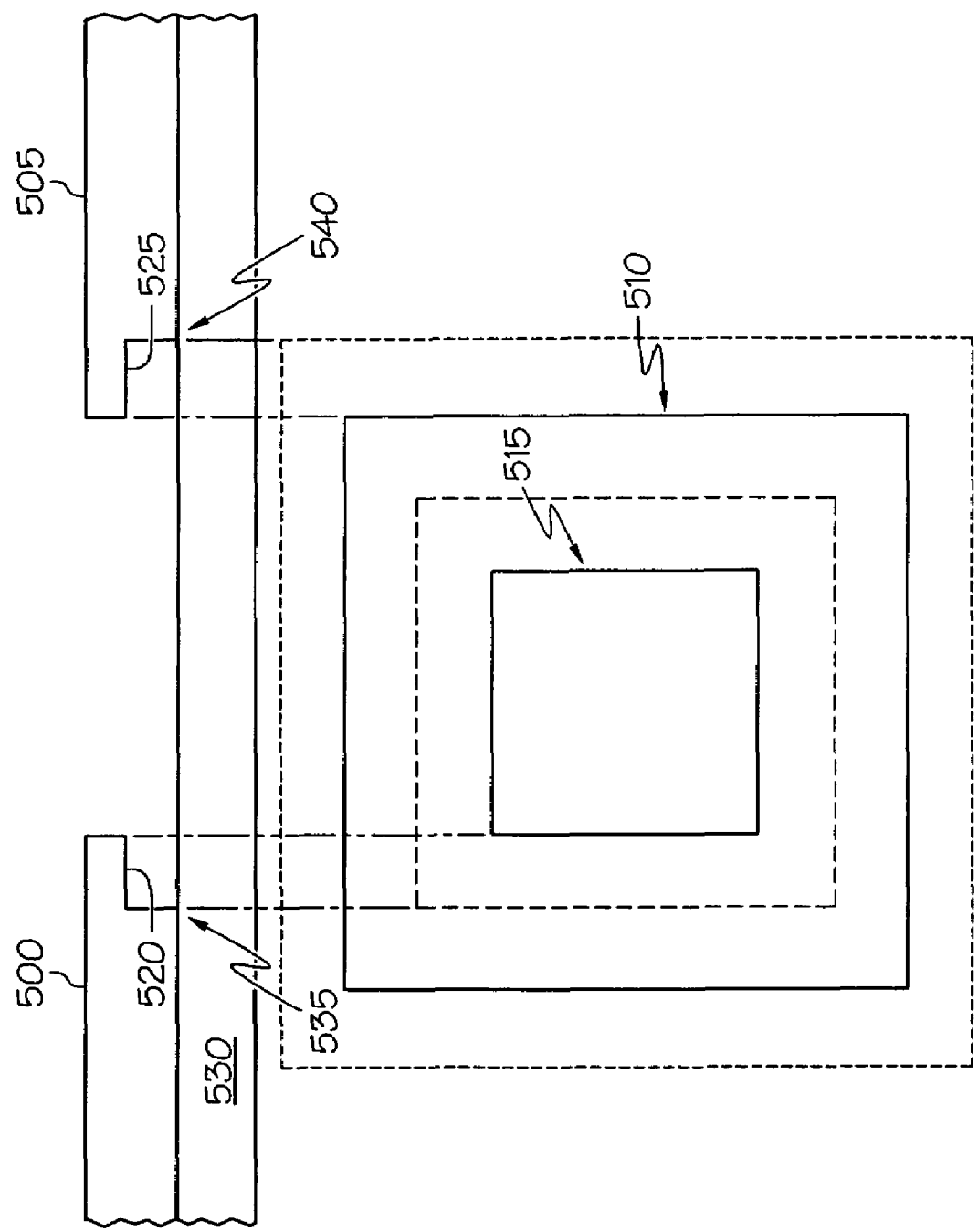
FIG. 6 shows a cross-section of one embodiment of a substrate and mask arrangement and a plan view of the resulting seal.
Figure 7:
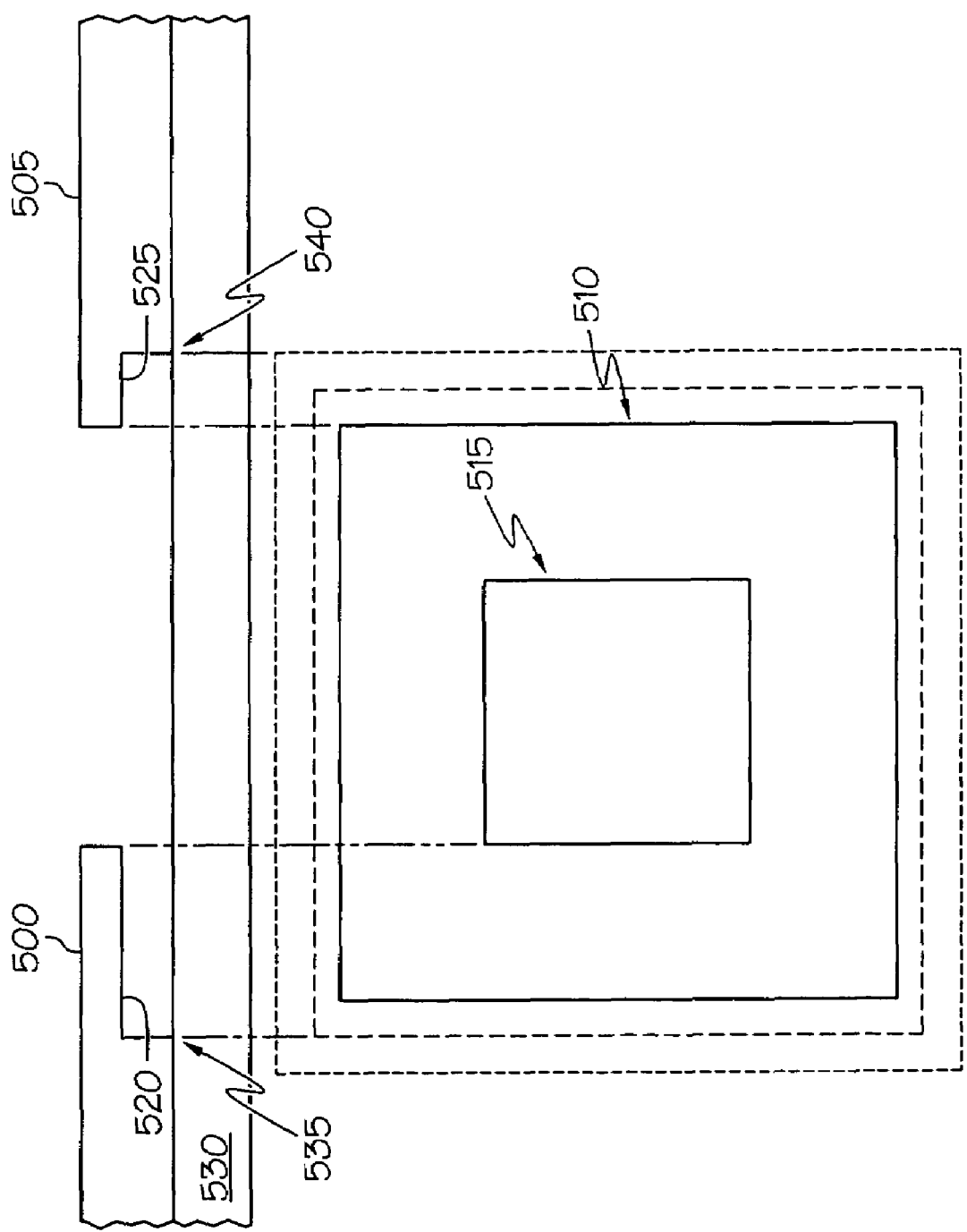
FIG. 7 shows a cross-section of another embodiment of a substrate and mask arrangement and a plan view of the resulting seal.

As shown in FIGS. 6 and 7, the mask 500 for the decoupling material has a smaller opening than the mask 505 for the barrier material. This allows the barrier layer 510 to encapsulate the decoupling layer 515.

The masks 500, 505 can optionally have an undercut 520, 525 that keeps the deposited decoupling material and/or barrier material from contacting the mask at the point where the mask contacts the substrate 530. The undercut 520 for the decoupling mask 500 can be sufficient to place the decoupling mask contact point 535 outside edge of barrier layer 510, as shown in FIG. 7.

If a composite is made using a continuous process and the edged sealed composite is cut in the transverse direction, the cut edges will expose the edges of the decoupling layers. These cut edges may require additional sealing if the exposure compromises barrier performance.

One method for sealing edges which are to be cut involves depositing a ridge on the substrate before depositing the barrier stack. The ridge interferes with the deposition of the decoupling layer so that the area of barrier material is greater than the area of decoupling material and the decoupling layer is sealed by the barrier layer within the area of barrier material. The ridge should be fairly pointed, for example, triangular shaped, in order to interrupt the deposition and allow the layers of barrier material to extend beyond the layers of decoupling material. The ridge can be deposited anywhere that a cut will need to be made, such as around individual environmentally sensitive devices. The ridge can be made of any suitable material, including, but not limited to, photoresist and barrier materials, such as described previously.

While certain representative embodiments and details have been shown for purposes of illustrating the invention, it will be apparent to those skilled in the art that various changes in the compositions and methods disclosed herein may be made without departing from the scope of the invention, which is defined in the appended claims.

What is claimed is:

1. An edge-sealed, encapsulated environmentally sensitive device comprising:

at least one initial barrier stack comprising at least one decoupling layer and at least one barrier layer, wherein a first decoupling layer of a first initial barrier stack has an area and wherein a first barrier layer of the first initial barrier stack has an area, the area of the first barrier layer of the first initial barrier stack being greater than the area of the first decoupling layer of the first initial barrier stack, and wherein the first barrier layer of the first initial barrier stack is in contact with a third barrier layer or an optional substrate, sealing the first decoupling layer of the first initial barrier stack between the first barrier layer of the first initial barrier stack and the third barrier layer or the optional substrate;

an environmentally sensitive device adjacent to the at least one initial barrier stack; and at least one additional barrier stack adjacent to the environmentally sensitive device on a side opposite the at least one initial barrier stack, the at least one additional barrier stack comprising at least one decoupling layer and at least one barrier layer, wherein a first decoupling layer of a first additional barrier stack has an area and wherein a first barrier layer of the first additional barrier stack has an area, the area of the first barrier layer of the first additional barrier stack being greater than the area of the first decoupling layer of the first additional barrier stack, wherein the first barrier layer of the first additional barrier stack is in contact with a fourth barrier layer, sealing the first decoupling layer of the first additional barrier stack between the first barrier layer of the first additional barrier stack and the fourth barrier layer, and wherein at least one barrier layer of at least one initial barrier stack is in contact with at least one barrier layer of at least one additional barrier stack, sealing the environmentally sensitive device between the at least one initial barrier stack and the at least one additional barrier stack forming an environmentally sensitive device seal, wherein an oxygen transmission rate through the environmentally sensitive device seal is less than 0.005 cc/m$^2$/day at 23° C. and 0% relative humidity.

2. The edge-sealed, encapsulated environmentally sensitive device of claim 1 wherein the first initial barrier stack includes at least two barrier layers, and wherein the second barrier layer of the first initial barrier stack has an area greater than the area of the first decoupling layer of the first initial barrier stack and wherein the first and second barrier layers of the first initial barrier stack are in contact and seal the first decoupling layer of the first initial barrier stack between them.

3. The edge-sealed, encapsulated environmentally sensitive device of claim 1 wherein the edge-sealed, encapsulated environmentally sensitive device includes at least two initial barrier stacks, wherein a first barrier layer of a second initial barrier stack has an area greater than the area of the first decoupling layer of the first initial barrier stack and wherein the first barrier layer of the first initial barrier stack and the first barrier layer of the second initial barrier stack are in contact and seal the first decoupling layer of the first initial barrier stack between them.

4. The edge-sealed, encapsulated environmentally sensitive device of claim 1 wherein at least one of the decoupling layers is selected from organic polymers, inorganic polymers, organometallic polymers, hybrid organic/inorganic polymer systems, silicates, or combinations thereof.

5. The edge-sealed, encapsulated environmentally sensitive device of claim 1 wherein at least one of the barrier layers comprises a barrier material selected from metals, metal oxides, metal nitrides, metal carbides, metal oxynitrides, metal oxyborides, or combinations thereof.

6. The edge-sealed, encapsulated environmentally sensitive device of claim 1 wherein at least one of the barrier layers comprises a barrier material selected from opaque metals, opaque ceramics, opaque polymers, and opaque cermets, and combinations thereof.

7. The edge-sealed, encapsulated environmentally sensitive device of claim 1 wherein the environmentally sensitive device is selected from organic light emitting devices, liquid crystal displays, displays using electrophoretic inks, light emitting diodes, displays using light emitting polymers, electroluminescent devices, phosphorescent devices, organic solar cells, inorganic solar cells, thin film batteries, or thin film devices with vias, or combinations thereof.

8. A method of making an edge-sealed, encapsulated environmentally sensitive device comprising:
providing at least one initial barrier stack, the at least one initial barrier stack comprising at least one decoupling layer and at least one barrier layer, wherein a first decoupling layer of a first initial barrier stack has an area and wherein a first barrier layer of the first initial barrier stack has an area, the area of the first barrier layer of the first initial barrier stack being greater than the area of the first decoupling layer of the first initial barrier stack, and wherein the first barrier layer of the first initial barrier stack is in contact with a third barrier layer or an optional substrate, sealing the first decoupling layer of the first initial barrier stack between the first barrier layer of the first initial barrier stack and the third barrier layer or the optional substrate;

placing an environmentally sensitive device adjacent to the at least one initial barrier stack; and placing at least one additional barrier stack adjacent to the environmentally sensitive device on a side opposite the at least one initial barrier stack, the at least one additional barrier stack comprising at least one decoupling layer and at least one barrier layer, wherein a first decoupling layer of a first additional barrier stack has an area and wherein a first barrier layer of the first additional barrier stack has an area, the area of the first barrier layer of the first additional barrier stack being greater than the area of the first decoupling layer of the first additional barrier stack, wherein the first barrier layer of the first additional barrier stack is in contact with a fourth barrier layer, sealing the first decoupling layer of the first additional barrier stack between the first barrier layer of the first additional barrier stack and the fourth barrier layer, and wherein at least one barrier layer of at least one initial barrier stack is in contact with at least one barrier layer of at least one additional barrier stack, sealing the environmentally sensitive device between the at least one initial barrier stack and the at least one additional barrier stack forming an environmentally sensitive device seal, wherein an oxygen transmission rate through the environmentally sensitive device seal is less than 0.005 cc/m$^2$/day at 23° C. and 0% relative humidity.

9. The method of claim 8 wherein the first initial barrier stack includes at least two barrier layers, and wherein the second barrier layer of the first initial barrier stack has an area greater than the area of the first decoupling layer of the first initial barrier stack and wherein the first and second barrier layers of the first initial barrier stack are in contact and seal the first decoupling layer of the first initial barrier stack between them.

10. The method of claim 8 wherein there are at least two initial barrier stacks, wherein a first barrier layer of a second initial barrier stack has an area greater than the area of the first decoupling layer of the first initial barrier stack and wherein the first barrier layer of the first initial barrier stack and the first barrier layer of the second initial barrier stack are in contact and seal the first decoupling layer of the first initial barrier stack between them.

11. The method of claim 8 wherein providing at least one initial barrier stack comprises depositing the at least one initial barrier stack adjacent to a substrate.

12. The method of claim 11 wherein depositing the at least one initial barrier stack adjacent to a substrate comprises depositing at least one decoupling layer before depositing at least one barrier layer.

13. The method of claim 11 wherein depositing the at least one initial barrier stack adjacent to a substrate comprises:
providing a mask with at least one opening;
depositing the first decoupling layer through the at least one opening in the mask; and
depositing the first barrier layer.

14. The method of claim 11 wherein depositing the at least one initial barrier stack adjacent to a substrate comprises:
depositing the first decoupling layer having an initial area of decoupling material which is greater than the area of the first decoupling layer;
etching the first decoupling layer having the initial area to remove a portion of the decoupling material so that the first decoupling layer has the area of the first decoupling layer; and
depositing the first barrier layer.

15. The method of claim 14 wherein etching the first decoupling layer comprises providing a solid mask over the first decoupling layer having the initial area of decoupling material, and etching the first decoupling layer having the initial area of decoupling material to remove the portion of the decoupling material outside the solid mask so that the first decoupling layer has the area of the first decoupling layer.

16. The method of claim 14 wherein the first decoupling layer is etched so that at least one edge of the first decoupling layer has a gradual slope.

17. The method of claim 14 wherein the first decoupling layer is etched using a reactive plasma.

18. The method of claim 17 wherein the reactive plasma is selected from $O_2$, $CF_4$, $H_2$, or combinations thereof.

19. The method of claim 8 further comprising depositing a ridge on the substrate before depositing the at least one barrier stack adjacent to the substrate, the ridge interfering with the deposition of the first decoupling layer so that the area of the first barrier layer is greater than the area of the first decoupling layer and the first decoupling layer is sealed by the first barrier layer within the area of the first barrier layer.

20. The method of claim 8 wherein placing the at least one barrier stack adjacent to the substrate comprises laminating the at least one barrier stack adjacent to the substrate.

21. The method of claim 20 wherein the at least one barrier stack is laminated adjacent to the substrate using a process selected from heating, soldering, using an adhesive, ultrasonic welding, and applying pressure.

* * * * *

UNITED STATES PATENT AND TRADEMARK OFFICE
CERTIFICATE OF CORRECTION

PATENT NO. : 7,198,832 B2 Page 1 of 1
APPLICATION NO. : 11/112860
DATED : April 3, 2007
INVENTOR(S) : Burrows et al.

It is certified that error appears in the above-identified patent and that said Letters Patent is hereby corrected as shown below:

"(75) Inventors: Paul E. Burrows, Kennewick, WA (US); Eric S. Mast, Richland, WA (US); Peter M. Martin, Kennewick, WA (US); Gordon L. Graff, West Richland, WA (US); Mark E. Gross, Pasco, WA (US)" should read as --(75) Inventors: Paul E. Burrows, Kennewick, WA (US); Eric S. Mast, Richland, WA (US); Peter M. Martin, Kennewick, WA (US); Gordon L. Graff, West Richland, WA (US); Mark E. Gross, Pasco, WA (US); Charles C. Bonham, Richland, WA (US); Wendy D. Bennett, Kennewick, WA (US); Michael G. Hall, West Richland, WA (US)--

Signed and Sealed this

Twenty-third Day of December, 2008

JON W. DUDAS
*Director of the United States Patent and Trademark Office*